United States Patent
Shimada

[11] Patent Number: 6,154,072
[45] Date of Patent: Nov. 28, 2000

[54] SIGNAL PRODUCTION CIRCUIT

[75] Inventor: Nobushige Shimada, Nara, Japan

[73] Assignee: Sharp Kabushiki Kaisha, Osaka, Japan

[21] Appl. No.: 09/178,616

[22] Filed: Oct. 26, 1998

[30] Foreign Application Priority Data

Oct. 27, 1997 [JP] Japan ..................................... 9-294648

[51] Int. Cl.[7] ...................................................... H03L 7/00
[52] U.S. Cl. .......................... 327/160; 327/161; 327/162; 327/263; 348/516; 348/524
[58] Field of Search ..................................... 327/160, 161, 327/162, 263; 348/516, 524

[56] References Cited

U.S. PATENT DOCUMENTS 5,093,750  3/1992  Park ........................................ 360/19.1

FOREIGN PATENT DOCUMENTS 59-123884  7/1984  Japan .
5-007136   1/1993  Japan .

*Primary Examiner*—Timothy P. Callahan
*Assistant Examiner*—Cassandra Cox

[57] ABSTRACT

A signal production circuit for producing a control signal used in a driving and controlling circuit of a display device externally input to the driving and controlling circuit, using an external interface signal. There is a vertical synchronization signal having a predetermined frequency and a reference clock signal in synchronization with the vertical synchronization signal. The signal production circuit includes: a first counter circuit for counting a number of reference clock signal pulses up to a value of a parameter which is preset based on a time interval of one cycle of the vertical synchronization signal and a predetermined target period. Also there is a second counter circuit for counting a number of reference clock signal pulses corresponding to the target period, the counting being performed based on the parameter and a number of reference clock signal pulses for one cycle of the vertical synchronization signal; and a signal output circuit for outputting a signal having a predetermined time period based on the number of reference clock signal pulses corresponding to the target period.

15 Claims, 15 Drawing Sheets

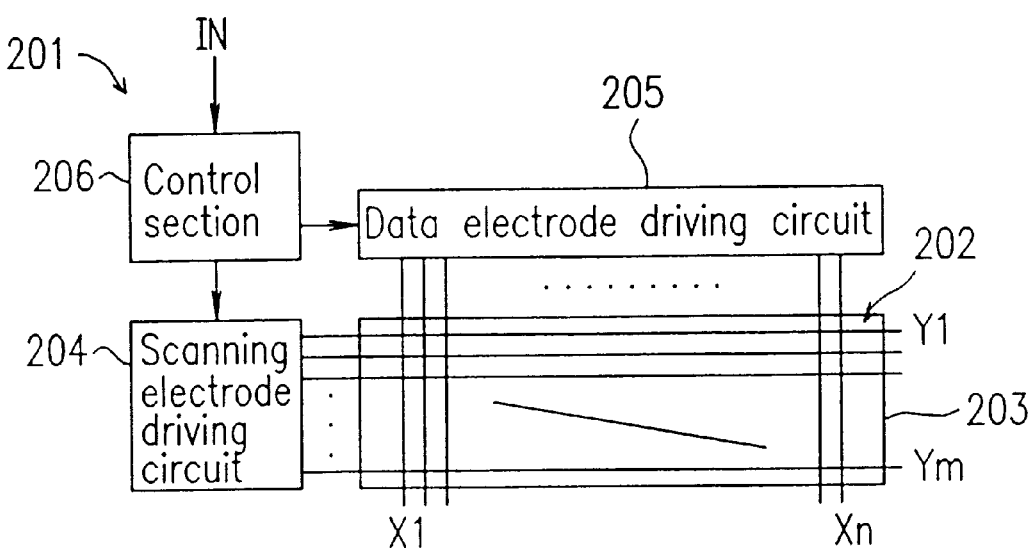
FIG. 11 [Prior art]

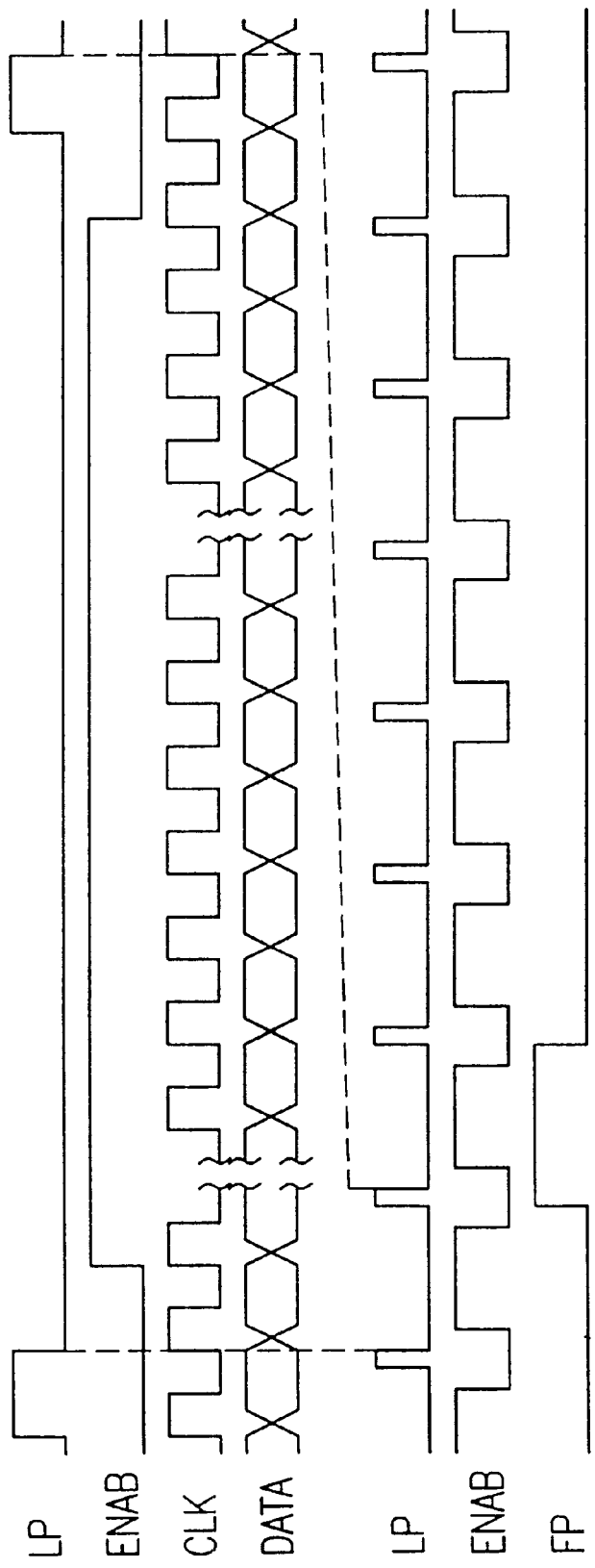
FIG. 12 [Prior art]

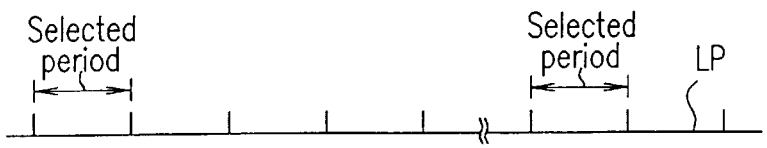
FIG. 14A [Prior art]
FIG. 14B [Prior art]
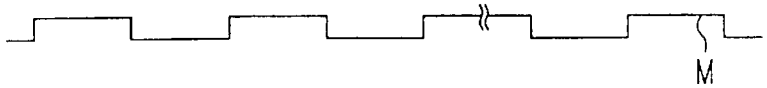
FIG. 14C [Prior art]
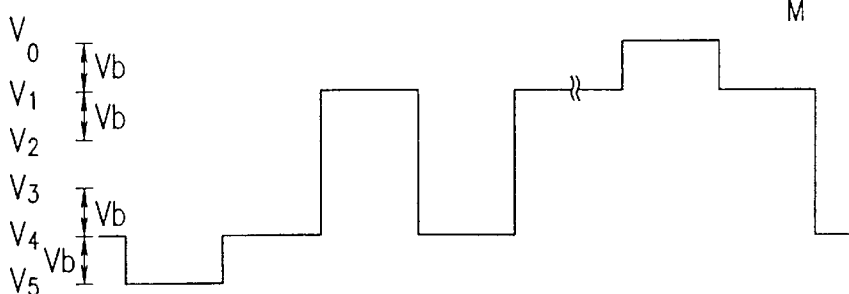
FIG. 14D [Prior art]
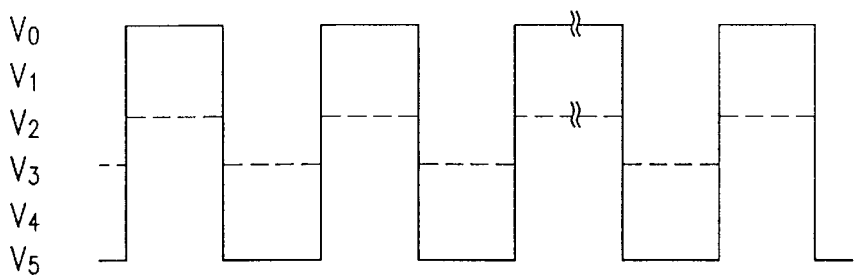
FIG. 14E [Prior art]
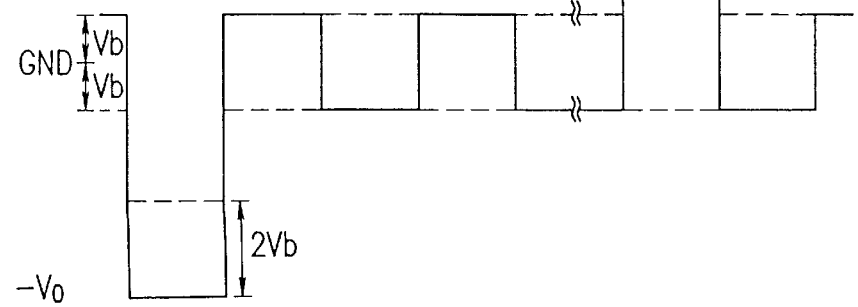

FIG. 15
[Prior art]
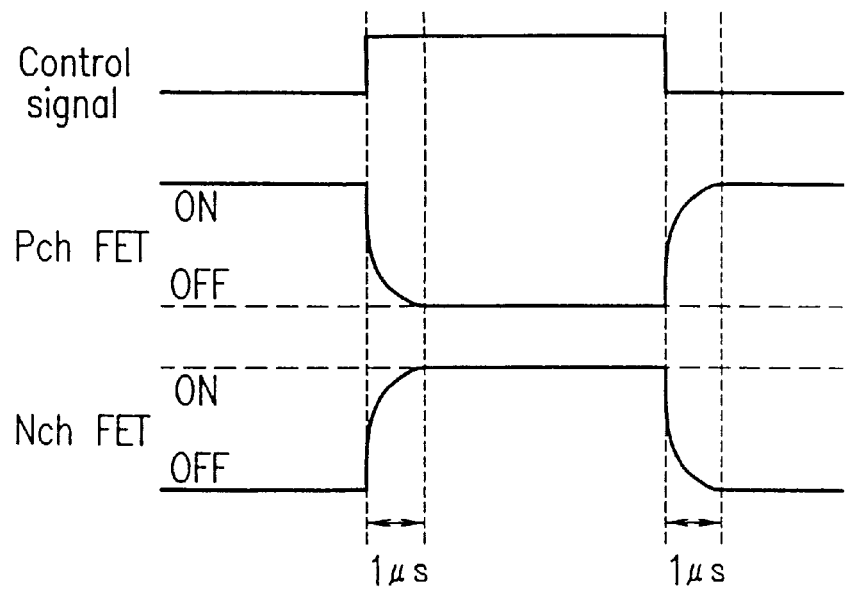
FIG. 16 [Prior art]
[Shifted signals]
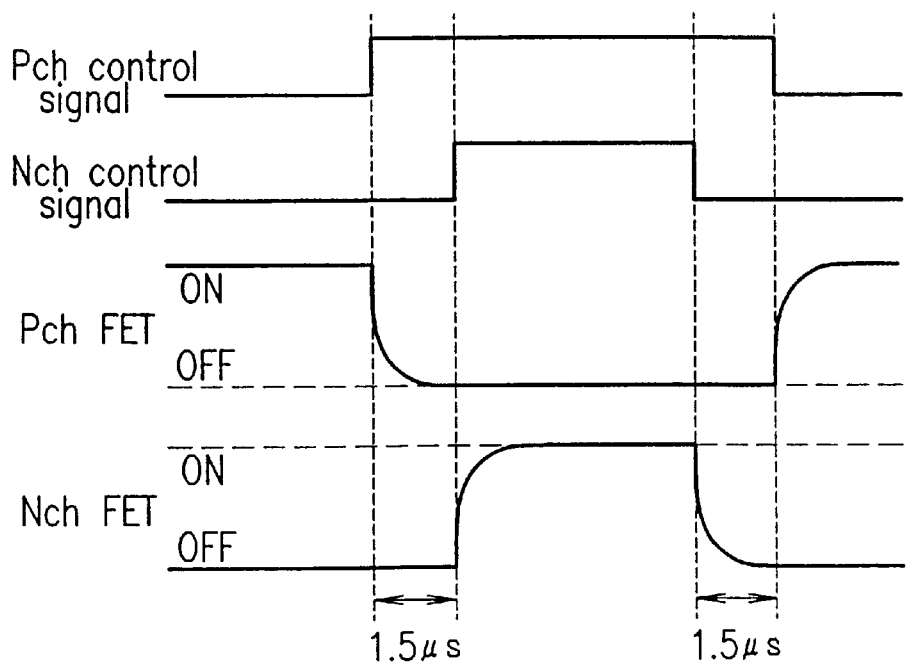

SIGNAL PRODUCTION CIRCUIT

BACKGROUND OF THE INVENTION

1. Field of the Invention

The present invention relates to a signal production circuit for producing a control signal which is used in a driving control circuit for driving and controlling a display panel, e.g., a flat panel, used in a wide range of applications such as an AV (audio vidual) apparatus and an OA (office automation) apparatus.

2. Description of the Related Art

In recent years, flat displays are replacing CRTs as next generation displays. Flat displays include a passive type liquid crystal display device which is used for a low-end product, and an active matrix type liquid crystal display device, an EL (electro-luminescent) display, a plasma display, etc., which are used for a high-end product. The active matrix type liquid crystal display device uses a 3-terminal element, e.g., a TFT (thin film transistor), or a 2-terminal element, e.g., an MIM (metal insulator metal) as a switching element. Typically, these flat displays use a display device having a matrix electrode structure, and are driven by a linear sequential driving method.

Referring to FIG. 11, a conventional liquid crystal display device 201 having a pixel driving section will be described as an example of such displays.

The liquid crystal display device 201 includes a display panel 203, which includes a plurality of data electrode lines X1 to Xn and a plurality of scanning electrode lines Y1 to Ym crossing the data electrode lines X1 to Xn. A plurality of pixels 202 are provided between the data electrode lines X1 to Xn and the scanning electrode lines Y1 to Ym at the respective intersections thereof. The pixels 202 are serially connected and each have an active element, which can be a 2-terminal element, a 3-terminal element, or the like.

An external interface signal IN is provided from an external circuit (not shown) to a control section 206 of the liquid crystal display device 201. For example, referring to FIG. 12, the external interface signal IN includes a data signal DATA to be displayed on the pixel 202 in synchronization with a reference clock CLK and a data enable signal ENAB indicating whether the data signal DATA is to be displayed. The external interface signal IN further includes a horizontal synchronization signal LP which is asserted for each of the scanning electrode lines Yj (j=1 to m) and a vertical synchronization signal FP which is asserted for each frame.

The vertical synchronization signal FP is input at a constant cycle for a particular display device and at a stable timing. While the vertical synchronization signal FP may cause a flicker when it is slower than a specific value, when the vertical synchronization signal FP is faster than the specific value, the power consumption of the display may increase, and additional components may be required to provide a display control circuit capable of being operated at the faster speed. Therefore, circuit designers attempt to operate the display device at a minimum possible speed which does not cause a flicker.

The number of reference clock CLK pulses for one cycle of the horizontal synchronization signal LP varies depending on the specification of the external circuit (not shown) which generates the external interface signal IN, and is often difficult to limit to a single value. For example, when designing a driving and controlling circuit using a memory IC for storing the data signal such as those typically called DRAMs which requires refresh pulses, the number of clock pulses varies due to the difference in display resolution among different display devices, and is thus often difficult to limit to a single value.

The control section 206 produces control signals indicating the driving voltage or the timing of the data electrode lines Xi (i=1 to n) and the scanning electrode lines Yj (j=1 to m). The control signals are sent to a scanning electrode line driving circuit 204 and a data electrode line driving circuit 205.

Based on the control signals, the scanning electrode line driving circuit 204 sequentially selects the scanning electrode lines Yj and applies a predetermined voltage thereto. Similarly, the data electrode line driving circuit 205 applies a predetermined voltage to the data electrode lines X1 to Xn according to the display data for the pixels 202.

Referring to FIGS. 14A to 14E, a voltage applied to the pixel 202 provided at each intersection of the data electrode line Xi and the scanning electrode line Yj will be described.

As illustrated in FIG. 14A, the horizontal synchronization signal LP is applied for each scanning electrode line. A selected pixel period (a period of time for which the pixel is selected) is one time period corresponding to the scanning electrode line Yj, as illustrated in FIG. 14A. FIG. 14B illustrates an alternating signal M produced based on the signal illustrated in FIG. 14A. The alternating signal M is a signal alternating at a predetermined cycle, e.g., for each scanning electrode line.

During a non-selected period, as illustrated in FIG. 14C, the scanning electrode line driving circuit 204 applies a voltage $V_1$ or $V_4$ to the scanning electrode line Yj according to the alternating signal M. As illustrated in FIG. 14D, the data electrode line driving circuit 205 selects a voltage to be applied to a data electrode line Xi depending upon whether the pixel 202 located at the intersection of the currently selected scanning electrode line Yj and the data electrode line Xi is turned ON. For example, $V_0$ or $V_2$ is selected when the alternating signal M is at a high level, and $V_3$ or $V_5$ is selected when the alternating signal M is at a low level. Thus, a voltage applied to the pixel 202 located at the intersection of the currently selected scanning electrode line Yj and the data electrode line Xi varies within a range from the ground level GND to a voltage Vb during a non-selected period, as illustrated in FIG. 14E.

During a selected period, on the other hand, $V_5$ or $V_0$ is applied to the scanning electrode line Yj according to the alternating signal M, as illustrated in FIG. 14C. As a result, when the data signal DATA indicates "ON", $-V_0$ or $V_0$ is applied to the pixel 202, as illustrated in FIG. 14E, thereby turning ON the pixel 202. When the data signal DATA indicates "OFF", a $-V_2$ or $V_2$ is applied to the pixel 202, thereby turning OFF the pixel 202. Thus, using the scanning electrode line driving circuit 204 and the data electrode line driving circuit 205, the pixel 202 can be driven by a voltage averaging method.

In order to realize an improved driving operation, it has been proposed to drive the device while shifting the signal timing by a certain length of time as described in Japanese Laid-open Publication No. 5-7136. Japanese Laid-open Publication No. 59-123884, discusses the necessity to shift the signal timing.

For example, consider a situation where an FET (field effect transistor) is used in the scanning electrode line driving circuit 204 or in the data electrode line driving circuit 205 in a voltage selection circuit of a power supply section. Referring to FIG. 15, after a control signal is externally input to the FET, there is a period of about 1 μs during which both of a Pch (P-channel) FET and an Nch (N-channel) FET are substantially ON before the signals are completely switched. A through current which may occur during such a period is problematic in terms of the reliability of the device and the power consumption reduction. This necessitates the shifting of the signal timing.

In view of this, a control signal for the Pch FET and another control signal for the Nch FET can be separately provided while shifting the respective input timings, as illustrated in FIG. 16, thereby solving the above-described problem.

Thus, it is desired to provide a method for producing an original control signal and another control signal whose timing is shifted from the original control signal by about 1 μs, so as to avoid a period during which both of the signals are substantially ON in order to realize an improved driving.

Conventionally, there have been two types of methods for producing shifted control signals:

1) For example, Japanese Laid-open Publication No. 5-7136. Uses a quartz oscillator, or the like, to generate an additional reference clock signal whose time interval is precisely known, and produce a second control signal by shifting from the original control signal by a period of time corresponding to a certain number of the additional reference clock signal pulses.

2) Use a resistor and a capacitor so as to delay a control signal, whose waveform is shaped by a Schmitt trigger input type IC, thereby obtaining another control signal shifted from the original control signal by a certain length of time.

However, both methods increase the number of components required and are thus inappropriate when the display device design aims to reduce the device size.

In accordance with the second method, a combination of a resistor and a capacitor approximately dictates one delay time. However, when a circuit using the resistor/capacitor combination is mass-produced, the delay time may vary among different modules due to the variation among individual resistors and capacitors.

In accordance with the first method, the signal generated by the quartz oscillator, or the like, is not in synchronization with the horizontal synchronization signals LP. Therefore, the following problems may occur when such a method is applied to a display device.

When there is a variation in the timing of a control signal used for applying a driving voltage, which should always be in synchronization with the horizontal synchronization signals LP, such a variation results in a perceivable defect in the display quality such as a flicker or a noise.

When the first method is applied to a display device, the following problems may also occur.

As the frequency of the quartz oscillator, or the like, is reduced to reduce the power consumption of the device, the variation in the signal timing with respect to the horizontal synchronization signals LP may become more significant. Conversely, when the frequency of the quartz oscillator, or the like, is increased, the synchronization accuracy may be improved to such a level that there is no defect in the display quality, but the power consumption increases. Moreover, a high performance circuit component may be required for providing a logic circuit capable of operating at a high frequency for processing such a signal. Furthermore, this can be a source of noise (i.e., undesired radiation).

The reference clock CLK included in the external interface signal IN is a signal similar to that generated by the quartz oscillator, or the like. The reference clock CLK is used for inputting the data signal DATA to the display device, and is in synchronization with the horizontal synchronization signals LP. If this signal can be used like the signal generated by the quartz oscillator, or the like, of the first method, the defect in the display quality may be eliminated by using an existing signal without providing an additional circuit component.

Unfortunately, as described above, it is difficult to limit the frequency of the reference clock CLK to a single, constant value. The specification of the driving control circuit and/or the resolution of the display screen may vary among different display device models, and the specification of the external interface signal IN varies accordingly. Therefore, when this technique is used in different display models, the number of reference clocks CLK pulses for one horizontal period cannot be limited to a single, constant value. Of course, the number of reference clocks CLK pulses for one frame period cannot be limited to a single, constant value. Accordingly, the length of time of one reference clock CLK also varies among different models, and thus is indefinite.

SUMMARY OF THE INVENTION

According to one aspect of this invention, a signal production circuit is provided for producing a control signal used in a driving and controlling circuit of a display device externally input to the driving and controlling circuit, using an external interface signal, which includes a vertical synchronization signal having a predetermined frequency and a reference clock signal in synchronization with the vertical synchronization signal. The signal production circuit includes: a first counter circuit for counting a number of reference clock signal pulses up to a value of a parameter which is preset based on a time interval of one cycle of the vertical synchronization signal and a predetermined target period; a second counter circuit for counting a number of reference clock signal pulses corresponding to the target period, the counting being performed based on the parameter and a number of reference clock signal pulses for one cycle of the vertical synchronization signal; and a signal output circuit for outputting a signal having a predetermined time period based on the number of reference clock signal pulses corresponding to the target period.

In one embodiment of the invention, a horizontal synchronization signal is input to the signal output circuit. The signal output circuit produces and outputs the control signal which is obtained by delaying the horizontal synchronization signal substantially by the target period.

In one embodiment of the invention, the parameter ($\alpha$) is a natural number which is calculated according to an expression:

$$\alpha = \text{(a time for one cycle of the vertical synchronization signal(s))}/\text{(the target period(s))}$$

where $\alpha$ is rounded off when a delay period of the signal to be output from the signal output circuit is greater than the target period and rounded up when the delay period is less than the target period. The number of reference clock signal pulses corresponding to the target period (t) counted by the second counter circuit is a natural number which is calculated according to an expression:

$$t = \text{(a number of reference clock signal pulses for one cycle of the vertical synchronization signal)}/\alpha$$

where t is rounded up when the delay period of the signal to be output from the signal output circuit is greater than the target period and rounded off when the delay period is less than the target period.

In one embodiment of the invention, the signal output circuit produces and outputs the control signal based on the number of reference clock signal pulses corresponding to the target period. The control signal is a reference clock signal which oscillates with a cycle corresponding to the target period.

In one embodiment of the invention, the parameter ($\beta$) is a natural number which is calculated according to an expression:

$$\beta=\{(\text{a time for one cycle of the vertical synchronization signal(s)})/(\text{the target period(s)})\}\times 2$$

where $\beta$ is rounded off when a cycle period of the signal to be output from the signal output circuit is greater than the target period and rounded up when the cycle is less than the target period. The number of reference clock signal pulses (t) counted by the second counter circuit and corresponding to one half of the target period is a natural number which is calculated according to an expression:

$$t=(\text{a number of reference clock signal pulses for one cycle of the vertical synchronization signal})/\beta$$

where t is rounded up when the cycle period of the signal to be output from the signal output circuit is greater than the target period and rounded off when the cycle is less than the target period.

In one embodiment of the invention, the signal production circuit further includes a signal generation circuit for receiving the number of reference clock signal pulses (t) and for generating a signal for each (t) reference clock signals. The generated signal is input to the signal output circuit.

In one embodiment of the invention, the signal production circuit further includes a memory circuit for storing the number of reference clock signal pulses corresponding to a target period counted by the second counter circuit. The stored number is thereafter input to a subsequent circuit, e.g., a signal output circuit or a signal generation circuit.

According to another aspect of this invention, a circuit is provided for driving and controlling a liquid crystal display device, which includes such a signal production circuit.

According to still another aspect of this invention, a method is provided for producing a control signal used in a driving and controlling circuit of a display device, using an external interface signal externally input to the driving and controlling circuit, which includes a vertical synchronization signal having a predetermined frequency and a reference clock signal in synchronization with the vertical synchronization signal. The method includes the steps of: (a) counting a number of reference clock signal pulses up to a value of a parameter which is preset based on a time interval of one cycle of the vertical synchronization signal and a predetermined target period; (b) counting a number of reference clock signal pulses corresponding to the target period, based on the parameter and a number of reference clock signal pulses for one cycle of the vertical synchronization signal; and (c) outputting a signal having a predetermined time based on the number of reference clock signal pulses corresponding to the target period.

In one embodiment of the invention, the signal outputting step (c) includes the step of producing and outputting the control signal which is obtained by delaying an input horizontal synchronization signal substantially by the target period.

In one embodiment of the invention, the preset parameter ($\alpha$) is a natural number which is calculated according to an expression:

$$\alpha=(\text{a time for one cycle of the vertical synchronization signal(s)})/(\text{the target period(s)})$$

where $\alpha$ is rounded off when a delay period of the signal to be output from the signal output circuit is greater than the target period and rounded up when the delay period of the signal to be output from the signal output circuit is less than the target period. The number of reference clock signal pulses corresponding to the target period (t) counted in the reference clock signal counting step (b) is a natural number which is calculated according to an expression:

$$t=(\text{a number of reference clock signal pulses for one cycle of the vertical synchronization signal})/\alpha$$

where t is rounded up when the delay period of the signal to be output from the signal output circuit is greater than the target period and rounded off when the delay period is less than the target period.

In one embodiment of the invention, the signal output step (c) includes the step of producing and outputting the control signal based on the number of reference clock signal pulses corresponding to the target period. The control signal is a reference clock signal which oscillates with a cycle corresponding to the target period.

In one embodiment of the invention, the preset parameter ($\beta$) is a natural number which is calculated according to an expression:

$$\beta=\{(\text{a time for one cycle of the vertical synchronization signal(s)})/(\text{the target period(s)})\}\times 2$$

where $\beta$ is rounded off when a cycle period of the signal to be output from the signal output circuit is greater than the target period and rounded up when the cycle is less than the target period. The number of reference clock signal pulses (t) counted in the reference clock signal counting step (b) and corresponding to one half of the target period is a natural number which is calculated according to an expression:

$$t=(\text{a number of reference clock signal pulses for one cycle of the vertical synchronization signal})/\beta$$

where t is rounded up when the cycle period of the signal to be output from the signal output circuit is greater than the target period and rounded off when the cycle is less than the target period.

In one embodiment of the invention, the signal production method further includes a signal generation step of receiving the number of reference clock signal pulses (t) and generating a signal for each (t) reference clock signals. The signal output step produces and outputs a reference clock signal which oscillates with a cycle corresponding to the target period.

In one embodiment of the invention, the signal production method further includes, after the reference clock signal counting step (b), the step of storing the number of reference clock signal pulses. The number of reference clock signal pulses stored in the storing step is thereafter used in a subsequent step, e.g., a signal output circuit or a signal generation circuit.

The function of the present invention will now be described.

As described above in the prior art section, above a display device receives an externally input vertical synchronization signal FP having a constant cycle (i.e., period). The vertical synchronization signal FP is input as the external interface signal IN and has a frequency which is indicated by the specification of the display device. Therefore, the vertical synchronization signal FP can be used as a reference time interval.

Conventionally, the vertical synchronization signal FP has not been used as a reference signal with a known time interval. The present invention is characterized by the use of the vertical synchronization signal FP as a reference signal with a known time interval.

The reference clock CLK which is also externally input to the display device is indefinite, as described above. For each different unit into which display devices are incorporated, however, the external interface signal IN, and thus the reference clock CLK, is constant. Therefore, the number of reference clocks CLK pulses for one frame period can be limited to a single, constant value. Thus, the length of time for one reference clock CLK is also constant for each model unit.

For each model unit, the timing signal specification of the external interface signal IN inherent in the display devices which are incorporated into the model unit is constant.

A signal production circuit including a logic circuit according to the present invention uses an external interface signal, which includes a vertical synchronization signal with a predetermined frequency externally input to the driving and controlling circuit and a reference clock signal in synchronization with the vertical synchronization signal which is used for inputting an external input horizontal synchronization signal and a data signal. In particular, the length of time of one cycle of the vertical synchronization signal and the number of reference clock signal pulses corresponding to one cycle of the vertical synchronization signal input during that length of time are used to count the number of reference clock signal pulses (a number of reference clock signal pulses) which corresponds to a target period (a length of time intended to be created). Using the number of reference clock (CLK) signal pulses corresponding to the target period, it is possible to shift the timing of a control signal used in the display device by the target period, or to produce a signal with a cycle having the length of time equal to the target period.

Thus, according to the present invention, it is not necessary to use an additional circuit component such as a quartz oscillator, or a resistor and a capacitor for generating a new reference timing signal, thereby avoiding an increase in the number of components required.

Thus, the invention described herein makes possible the advantage of providing a signal production circuit capable of producing a signal which can be used in different display device models, using an externally input reference clock.

This and other advantages of the present invention will become apparent to those skilled in the art upon reading and understanding the following detailed description with reference to the accompanying figures.

BRIEF DESCRIPTION OF THE DRAWINGS

FIG. 11 is a block diagram illustrating a conventional liquid crystal display device which is driven by a voltage averaging method;

FIG. 12 shows waveform diagrams of exemplary signals externally provided to a display device, for illustrating both prior art and the present invention;

FIGS. 14A to 14E show waveform diagrams illustrating a voltage applied to a pixel driven by a voltage averaging method;

FIG. 15 shows waveform diagrams in a case where a PchFET and an NchFET are used as power source selection and switching circuits, and controlled at the same timing; and FIG. 16 shows waveform diagrams in a case where a PchFET and an NchFET are used as power source selection and switching circuits, and controlled at shifted timings.

DESCRIPTION OF THE PREFERRED EMBODIMENTS

The present invention will now be described by way of illustrative examples with reference to the accompanying figures.

EXAMPLE 1

Figure 13A:
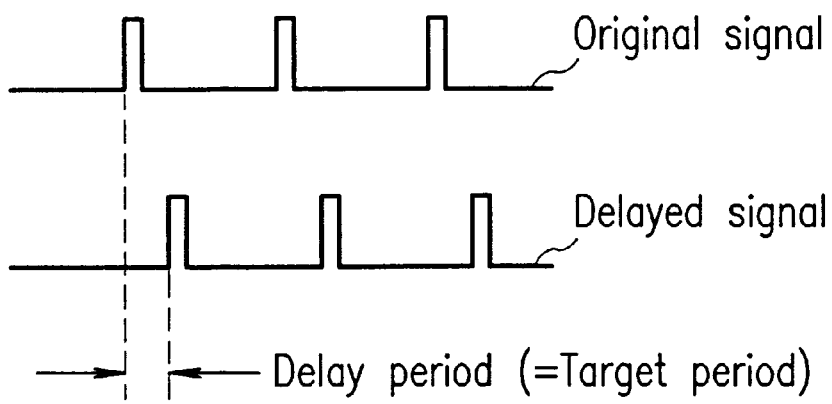
FIG. 13A illustrates a target period in Example 1 of the present invention.

In this example, a method of counting the number of reference clock signal pulses corresponding to a target period will be described. The number of reference clock signal pulses is used for shifting, by the target period, the timing of a control signal used in the display device. A "target period" in this example corresponds to a delay period from the rising edge of the original signal to the rising edge of the delayed signal as shown by the delay period in FIG. 13A.

Before arranging logic circuits into a signal production circuit to be used in the display device, the time (s) of one cycle of the FP signal is divided by the target period (s), thereby obtaining a parameter $\alpha$ which is based on a time interval of one cycle of the vertical synchronization signal and the predetermined target period, as shown in Expression (1) below. The parameter $\alpha$ is preset to a counter circuit.

$$\alpha = (\text{FP one cycle(s)})/(\text{target period(s)}) \quad (1)$$

Since the parameter $\alpha$ is preset to the counter circuit, it should be a natural number. However, the actual delay period of a final produced signal inevitably includes an error in a range equal to the width of one reference clock signal. Therefore, the parameter α is rounded off when the actual delay period of the signal to be output from the signal output circuit is greater than the target period, and is rounded up when it is less than the target period. Thus, an error is absorbed in an advantageous, or less problematic, manner.

Then, a counter circuit for implementing Expression (2) below is provided so as to calculate the number of reference clock signal pulses t which corresponds to the target period.

$$t = (\text{number of reference clock signal pulses for one cycle of FP signal})/\alpha \qquad (2)$$

Since the value t is counted by a counter circuit, it should be a natural number. Therefore, the value t is rounded up when the delay period of the signal to be output from the signal output circuit is greater than the target period, and is rounded off when it is less than the target period. Thus, an error in the range equal to the width of one reference clock signal is absorbed.

Assume the following parameters for a particular configuration of the signal production circuit.

FP signal one cycle=16.7 ms
Target period=1.5 μs (delay period<target period)
Number of CLK pulses for FP signal one cycle=420000

The number of CLK pulses "420000" is calculated from 800×525, which is most commonly used in a display with a resolution of 640×480, including the input period of a non-displayed period.

The parameter a is obtained by rounding off the value 0.0167/0.0000015 according to Expression (1). The fractional part is rounded off in this example because the delay period is greater than the target period. Thus, α=11133.

The value t is obtained by rounding up the value 420000/11133 according to Expression (2). The fractional part is rounded up in this example because the delay period is greater than the target period. Thus, t=38.

Since the length of time for one reference clock signal CLK is 16.7 ms/420000=39.8 ns, the length of time corresponding to the calculated number of clocks (t=38) is 39.8 ns×38 =1.51 μs.

Figure 1:
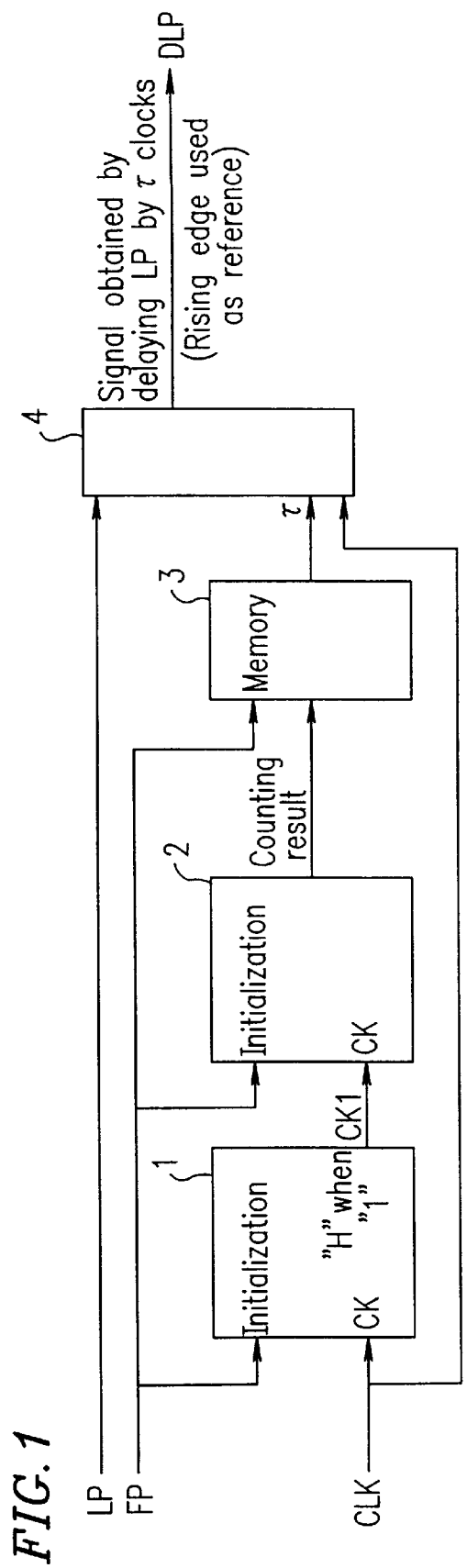
FIG. 1 is a block diagram illustrating a signal production circuit according to Example 1 of the present invention.

FIG. 1 is a block diagram illustrating a signal production circuit according to Example 1 of the present invention. FIGS. 2 to 5 are block diagrams illustrating respective components in greater detail.

The signal production circuit of Example 1 includes a first counter circuit 1, a second counter circuit 2, a memory 3 and a signal output circuit 4.

The input signals LP, FP and CLK in FIG. 1 each have a waveform as that illustrated in FIG. 12, and the vertical synchronization signal FP and the horizontal synchronization signals LP change at the rising edge of the reference clock signal CLK.

The first counter circuit 1 for counting a number of the reference clock signal CLK pulses which are input thereto, up to the preset value of the parameter α. The first counter circuit 1 starts counting when it receives the vertical synchronization signal FP. When the number of the reference clock signal pulses counted by the first counter circuit 1 reaches the value of α, the first counter circuit 1 outputs a signal CK1 to the second counter circuit 2. In other words, the first counter circuit 1 operates with a cycle of α, and generates a signal CK1 at the end of each cycle of α to increment the second counter 2.

Figure 2:
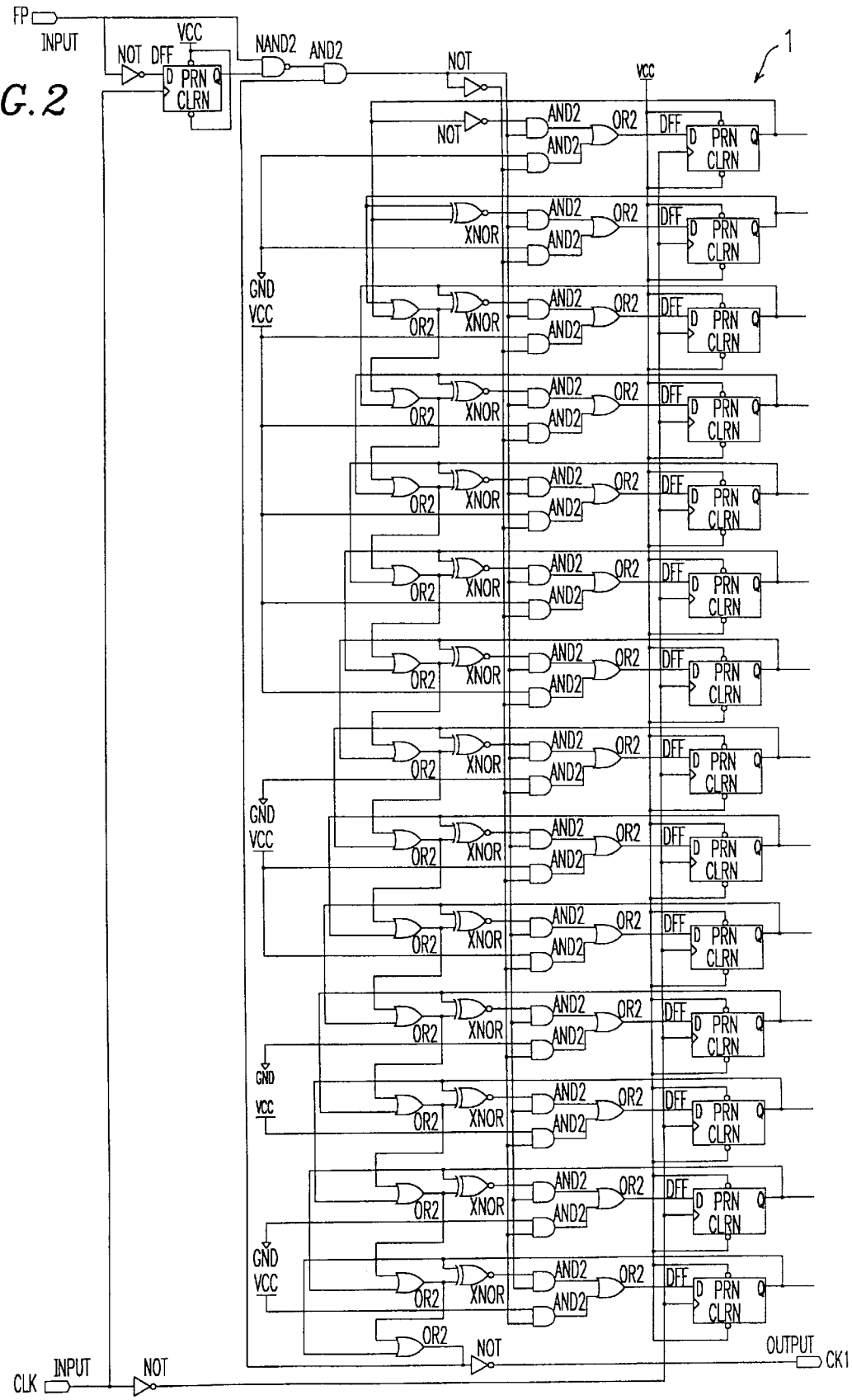
FIG. 2 is a block diagram illustrating a first counter in the signal production circuit of FIG. 1 in greater detail.

FIG. 2 illustrates the first counter 1, which is a down counter. The first counter 1 is preset to have an initial value "11133" (=α) at the first falling edge of the reference clock signal CLK after the vertical synchronization signal FP rises to a high level. There-after, the first counter 1 decrements each time the reference clock signal CLK falls to a low level, from 11133 to 11132, 11131, . . . , 2, 1, 11133, 11132, . . . . Each time the value of the first counter 1 becomes 1, it generates the signal CK1 which increments the second counter 2.

Although decimal numbers are used in the above description for simplicity, the first counter 1 actually consists of a binary number, not a decimal number. The binary numbers used in the first counter circuit 1 correspond to the decimal numbers as follows.

| (binary) | (decimal) |
|---|---|
| 00000000000000 | 1 |
| 00000000000001 | 2 |
| . . . | . . . |
| 10101101111011 | 11132 |
| 10101101111100 | 11133 |

Referring to FIG. 2, the output values of DFF circuits respectively correspond to the digits of the binary number. The uppermost DFF circuit in the figure corresponds to the least significant bit of the binary number. Sections for setting the initial value are also illustrated in the circuit diagram so as to facilitate a circuit configuration with a different initial value. These sections are represented by "VCC" for "1" and "GND" for "0".

Figure 3:
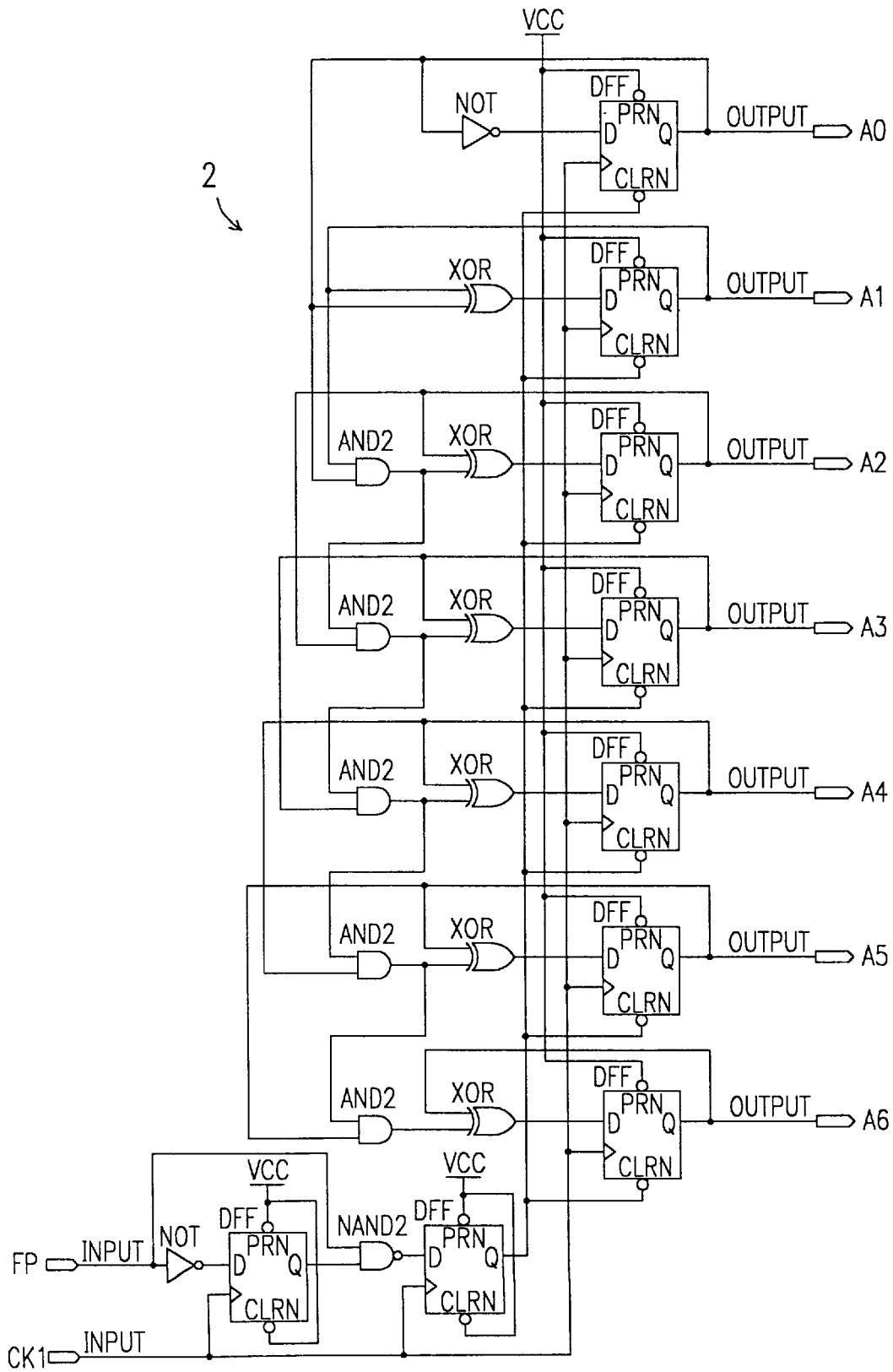
FIG. 3 is a block diagram illustrating a second counter in the signal production circuit of FIG. 1 in greater detail.

FIG. 3 illustrates the second counter 2, which is an up counter for counting the number of signal pulses CK1 generated by the first counter 1 for one cycle of the vertical synchronization signal FP. The initial value of the second counter 2 is set to "1" when the parameter α is to be rounded up and "0" when it to be rounded off.

Referring to FIG. 3, the second counter 2 is initialized at a timing which is one reference clock after the initialization of the first counter 1, which occurs after the counting result of the second counter 2 is stored in the memory 3 provided in the subsequent stage. This prevents the entire circuit from malfunctioning.

Figure 4:
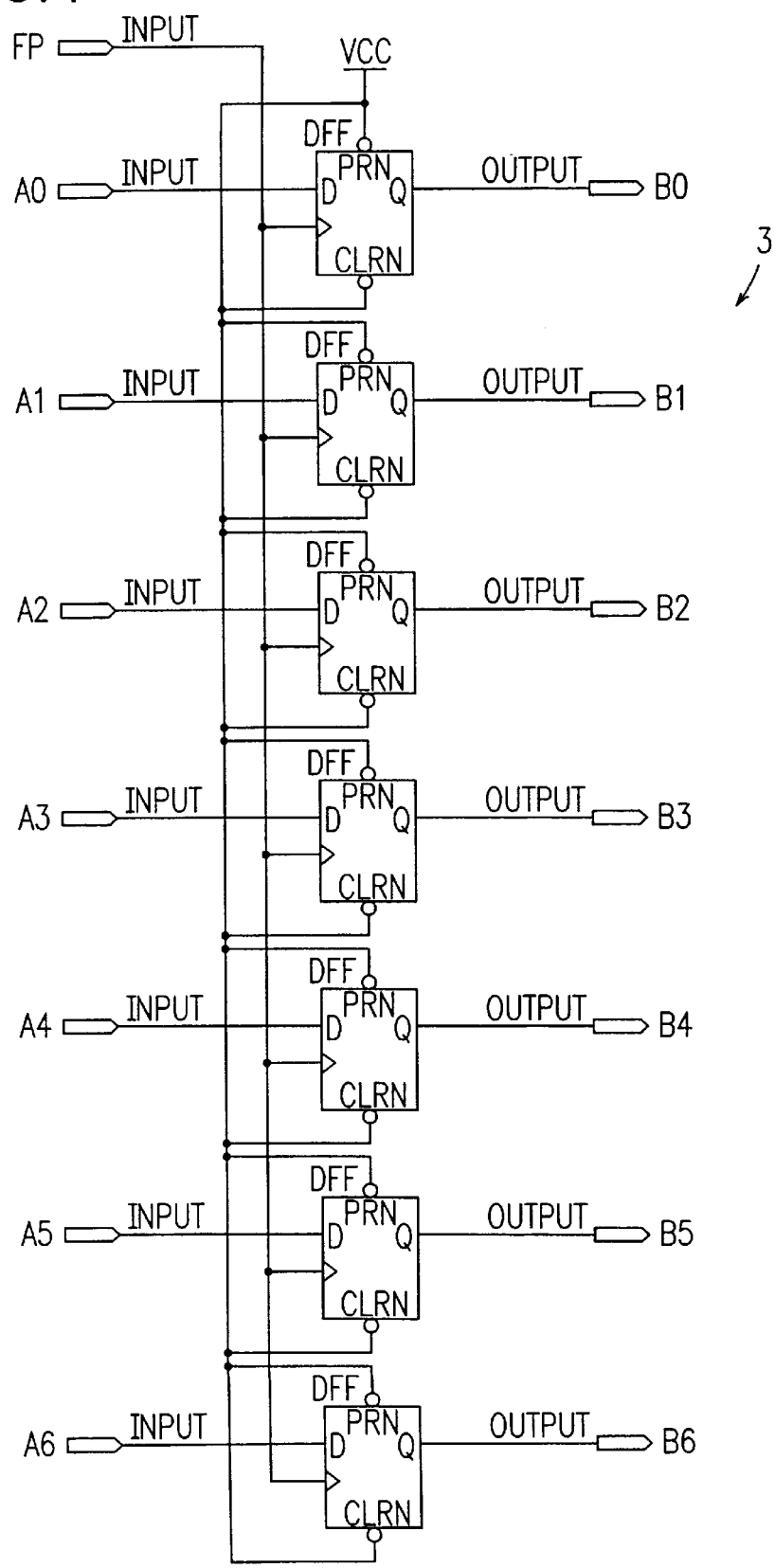
FIG. 4 is a block diagram illustrating a memory in the signal production circuit of FIG. 1 in greater detail.

After the second counter 2 is set with its initial value, as described above, the second counter 2 increments each time it receives the signal CK1 from the first counter 1 until the end of one cycle of the vertical synchronization signal FP (i.e., until a rising edge of the vertical synchronization signal FP is reached). A value of the second counter 2 at that point (i.e. the value t) is stored in the memory 3, which is shown in FIG. 4. In the present example, the value of the second counter 2 at that point is "38".

Figure 5:
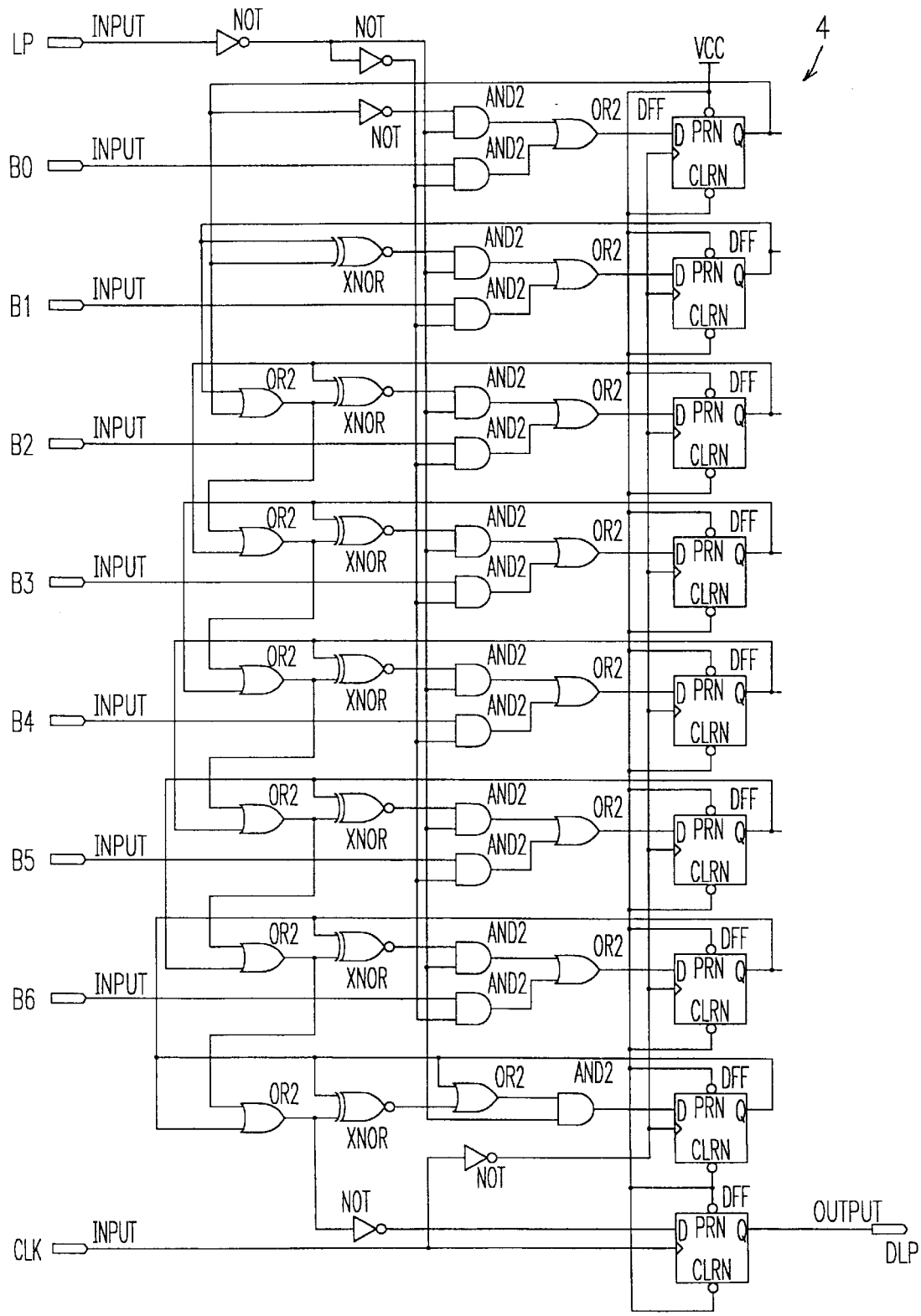
FIG. 5 is a block diagram illustrating a signal output circuit in the signal production circuit of FIG. 1 in greater detail.

Using the value t stored in the memory 3, the signal output circuit 4 illustrated in FIG. 5 receives the horizontal synchronization signals LP which is "high" for one reference clock signal CLK, and produces and outputs a signal DLP which is obtained by delaying the falling edge of the horizontal synchronization signal LP by t reference clock signals CLK, corresponding to the target period, (38 clocks in this example since the value stored in the memory 3 is 38).

In the present example, the falling edge of the horizontal synchronization signal LP is used as a reference, whereas the rising edge of the delayed signal DLP output by the circuit 4 is used as a reference.

EXAMPLE 2

Figure 13B:
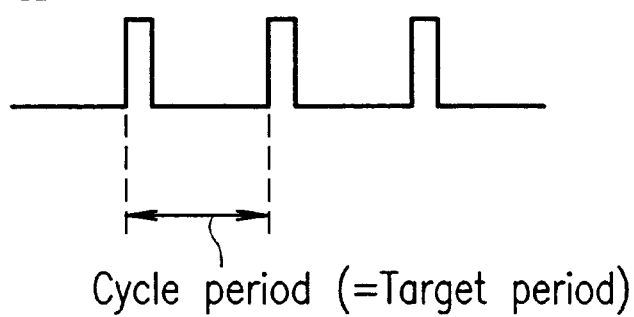
FIG. 13B illustrates a target period in Example 2 of the present invention.

In this example, another method of counting the number of reference clock signal pulses used for producing a clock signal which oscillates with a cycle corresponding to the target period will be described. A "target period" in this example corresponds to a cycle period shown in FIG. 13B.

Before arranging logic circuits into a signal production circuit to be used in the display device, a parameter β, which is to be preset to a counter circuit and based on a time interval of one cycle of the vertical synchronization signal and the predetermined target period, is calculated by dividing the time (s) of one cycle of the FP signal by the target period (s), and multiplying the result by 2, as shown in Expression (3) below.

$$\beta = \{(FP\ one\ cycle(s))/(target\ period(s))\} \times 2 \qquad (3)$$

Since the parameter β is preset to the counter circuit, it should be a natural number. However, the actual cycle period of a final produced signal inevitably includes an error in a range equal to the width of one reference clock signal. Therefore, the parameter β is rounded off when the actual cycle period of the signal to be output from the signal output circuit is greater than the target period, and is rounded up when it is less than the target period. Thus, an error is absorbed in an advantageous, or less problematic, manner.

Then, a counter circuit for implementing Expression (4) below is provided so as to calculate the number of reference clock signal pulses t which corresponds to one half of the target period.

$$t = (number\ of\ reference\ clock\ signal\ pulses\ per\ for\ one\ cycle\ of\ FP\ signal)/\beta \qquad (4)$$

Since the value t is counted by a counter circuit, it should be a natural number. Therefore, the value t is rounded up when the cycle period of the signal to be output from the signal output circuit is greater than the target period, and is rounded off when it is less than the target period. Thus, an error in the range equal to the width of one reference clock signal is absorbed.

Assume the following parameters for a particular configuration of the signal production circuit.

FP signal one cycle=16.7 ms

Target period=41.7 μs (cycle period<target period; target frequency: 24 kHz)

Number of CLK pulses for FP signal one cycle=420000

The parameter β is obtained by rounding up the value (0.0167/0.0000417)×2 according to Expression (3). The fractional part is rounded up in this example because the cycle period of the signal to be output from the signal output circuit is less than the target period. Thus, β=801.

The value t is obtained by rounding off the value (420000/801) according to Expression (4). The fractional part is rounded off in this example because the cycle period of the signal to be output from the signal output circuit is less than the target period. Thus, t=524.

Since the length of time for one reference clock signal CLK is 16.7 ms/420000=39.8 ns, the length of time corresponding to the calculated number of clocks (t=524) is 39.8 ns×524=20.85 μs.

Since one cycle of the final produced clock signal includes two t's, 2×20.85 μs=41.7 μs.

Figure 6:
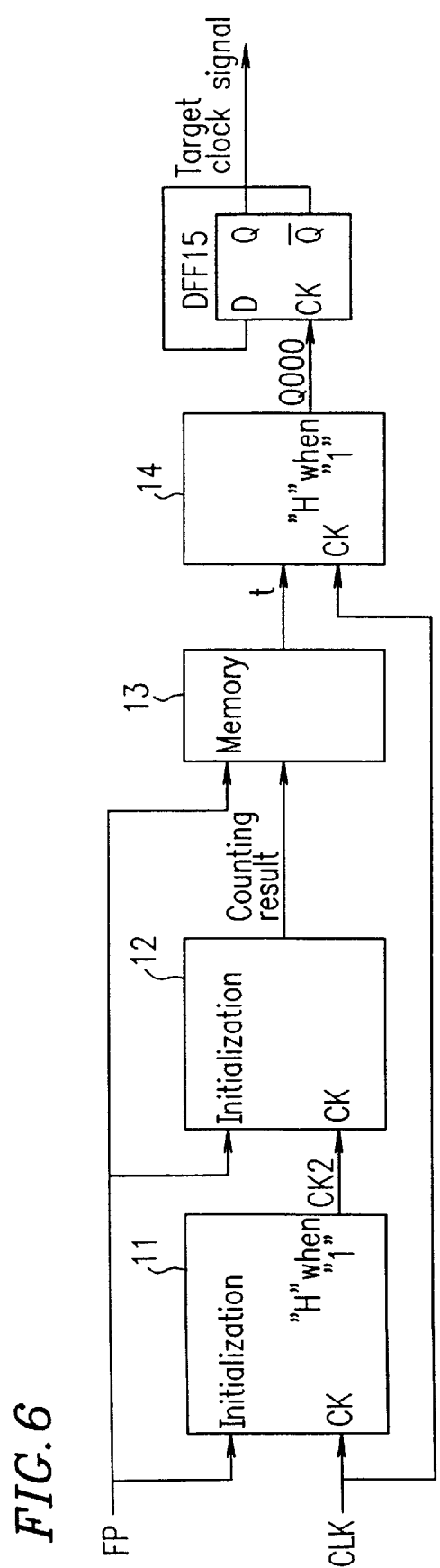
FIG. 6 is a block diagram illustrating a signal production circuit according to Example 2 of the present invention.

FIG. 6 is a block diagram illustrating a signal production circuit according to Example 2 of the present invention. FIGS. 7 to 10 are block diagrams illustrating respective components in greater detail.

The signal production circuit of Example 2 includes a third counter 11, a fourth counter 12, a second memory 13, a fifth counter 14 and a DFF 15.

The input signals FP and CLK in FIG. 6 each have a waveform as that illustrated in FIG. 12, and the vertical synchronization signal FP and the horizontal synchronization signals LP change at the rising edge of the reference clock signal CLK.

The third counter circuit 11 for counting a number of the reference clock signal CLK pulses which are input thereto, up to the preset value of the parameter β. The third counter circuit 11 starts counting when it receives the vertical synchronization signal FP. When the number of the reference clock signal pulses counted by the third counter circuit 11 reaches the value of β, the third counter circuit 11 outputs a signal CK2 to the fourth counter circuit 12. In other words, the third counter circuit 11 operates at a cycle of β, and thus generates a signal CK2 at the end of each cycle of β to increment the fourth counter 12.

Figure 7:
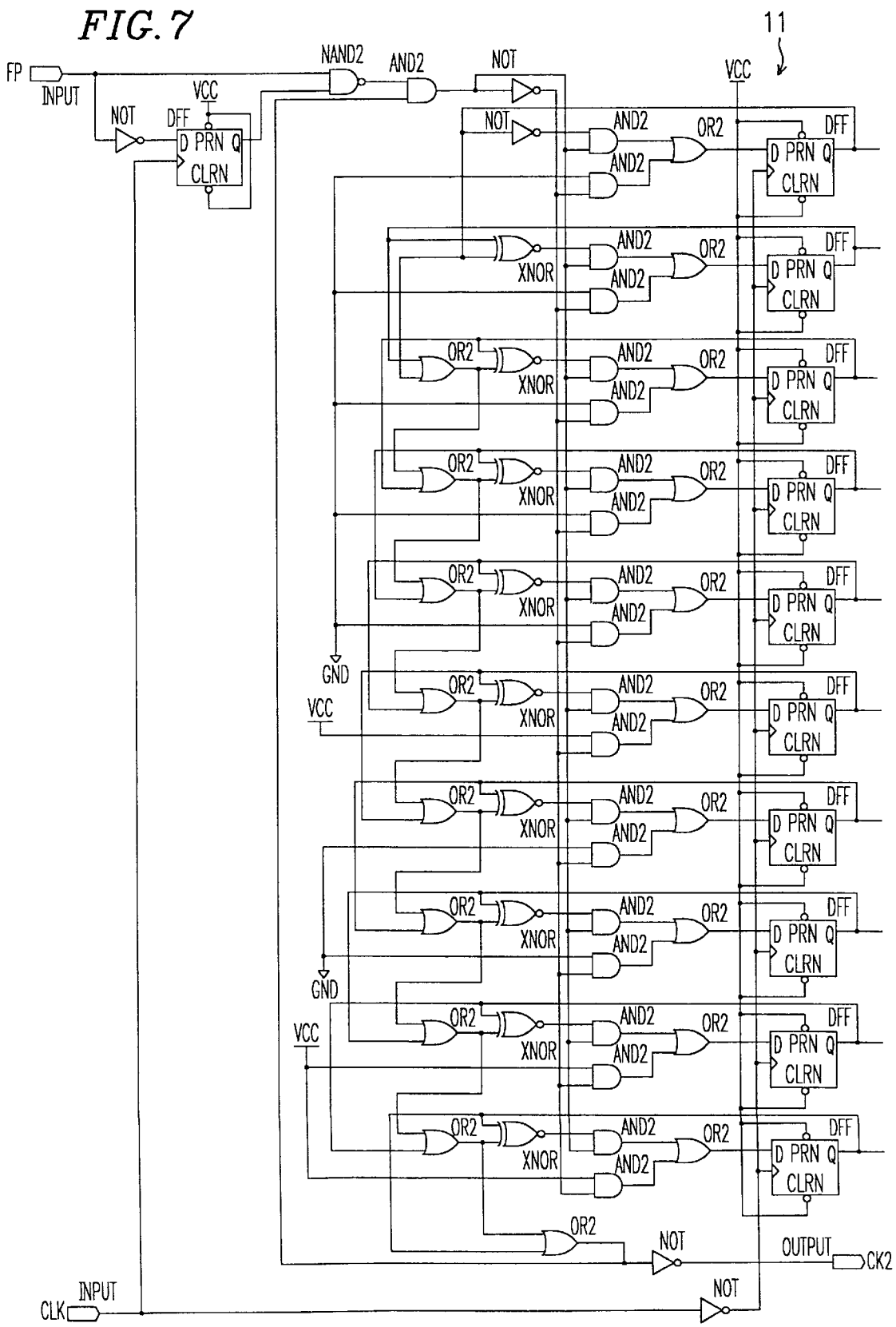
FIG. 7 is a block diagram illustrating a third counter in the signal production circuit of FIG. 6 in greater detail.

FIG. 7 illustrates the third counter 11, which is a down counter. The third counter 11 is preset to have an initial value "801" corresponding to β at the first falling edge of the reference clock signal CLK after the vertical synchronization signal FP rises to a high level. Thereafter, the third counter 11 decrements each time the reference clock signal CLK falls to a low level, from 801 to 800, 799, . . . , 2, 1, 801, 800, . . . . Each time the value of the third counter 11 becomes 1, it generates the signal CK2 which increments the fourth counter 12.

Although decimal numbers are used in the above description for simplicity, the third counter 11 actually consists of a binary number, not a decimal number. The binary numbers used in the third counter circuit 11 correspond to the decimal numbers as follows.

| (binary) | (decimal) |
|---|---|
| 0000000000 | 1 |
| 0000000001 | 2 |
| . . . | . . . |
| 1100011111 | 800 |
| 1100100000 | 801 |

Referring to FIG. 7, the output values of DFF circuits respectively correspond to the digits of the binary number. The uppermost DFF circuit in the figure corresponds to the least significant bit of the binary number. Sections for setting the initial value are also illustrated in the circuit diagram so as to facilitate a circuit configuration with a different initial value. These sections are represented by "VCC" for "1" and "GND" for "0".

Figure 8:
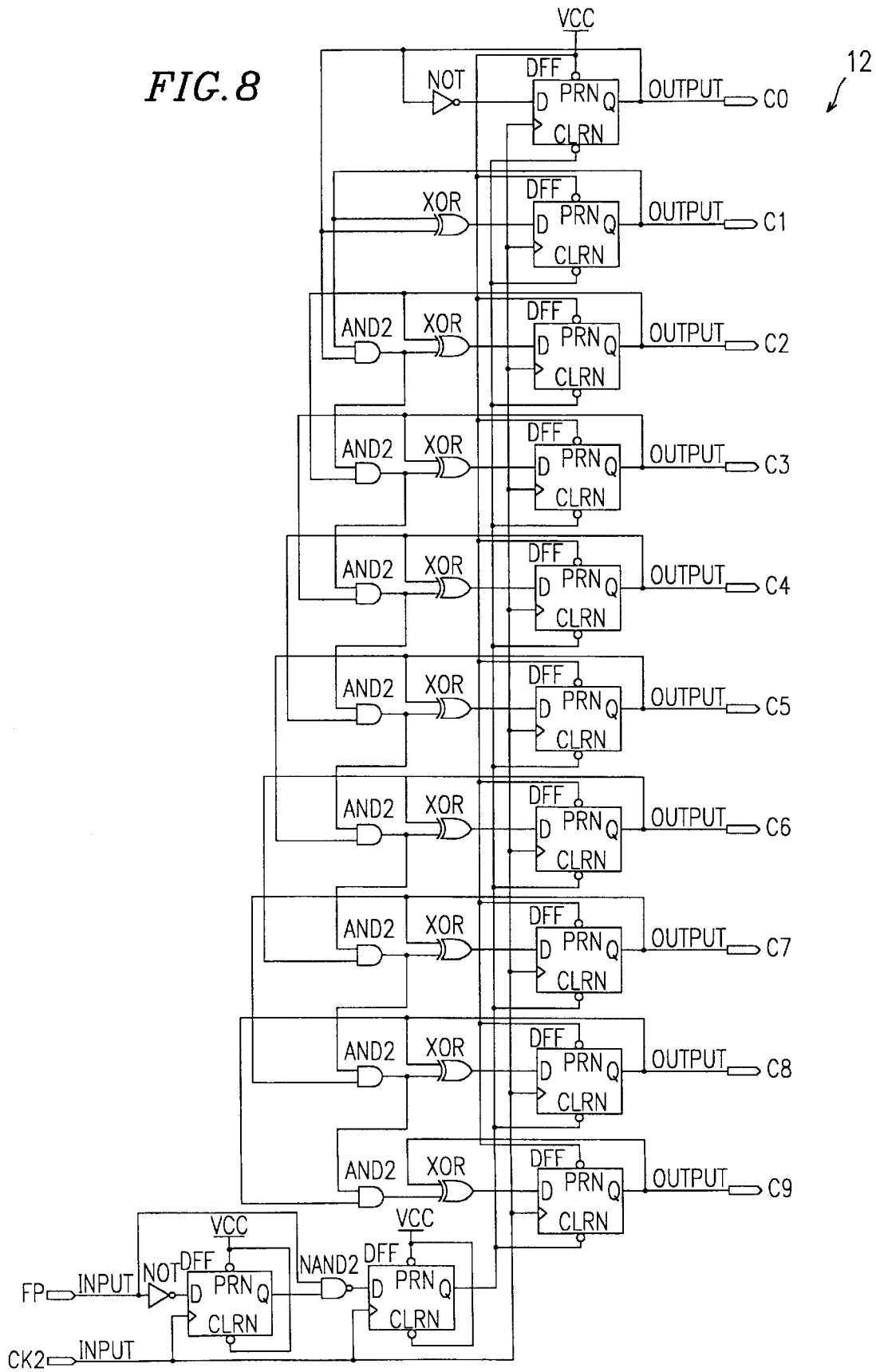
FIG. 8 is a block diagram illustrating a fourth counter in the signal production circuit of FIG. 6 in greater detail.

FIG. 8 illustrates the fourth counter 12, which is an up counter for counting the number of signal pulses CK2 generated by the third counter 11 for one cycle of the vertical synchronization signal FP. The initial value of the fourth counter 12 is set to "1" when the parameter β is to be rounded up and "0" when it to be rounded off.

Referring to FIG. 8, the fourth counter 12 is initialized at a timing which is one reference clock after the initialization of the third counter 11, which occurs after the counting result of the fourth counter 12 is securely stored in the second memory 13 provided in the subsequent stage. This prevents the entire circuit from malfunctioning.

Figure 9:
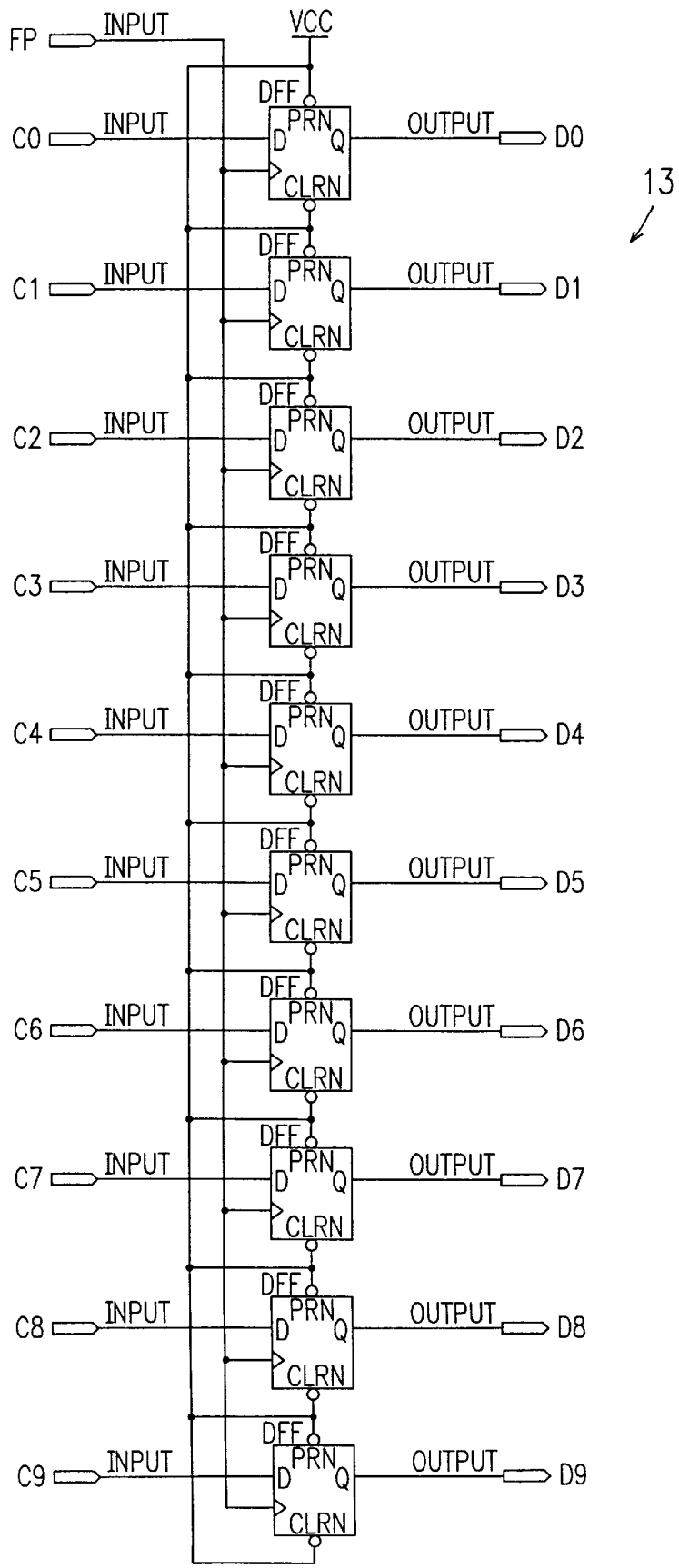
FIG. 9 is a block diagram illustrating a second memory in the signal production circuit of FIG. 6 in greater detail.

After the forth counter 12 is set with its initial value, as described above, the forth counter 12 increments each time it receives the signal CK2 from the third counter 11 until the end of one cycle of the vertical synchronization signal FP (i.e., until a rising edge of the vertical synchronization signal FP is reached). A value of the counter 12 at that point (i.e. the value t) is stored in the memory 13, which is shown in FIG. 9. In the present example, the value of the forth counter 12 at that point is "524".

Figure 10:
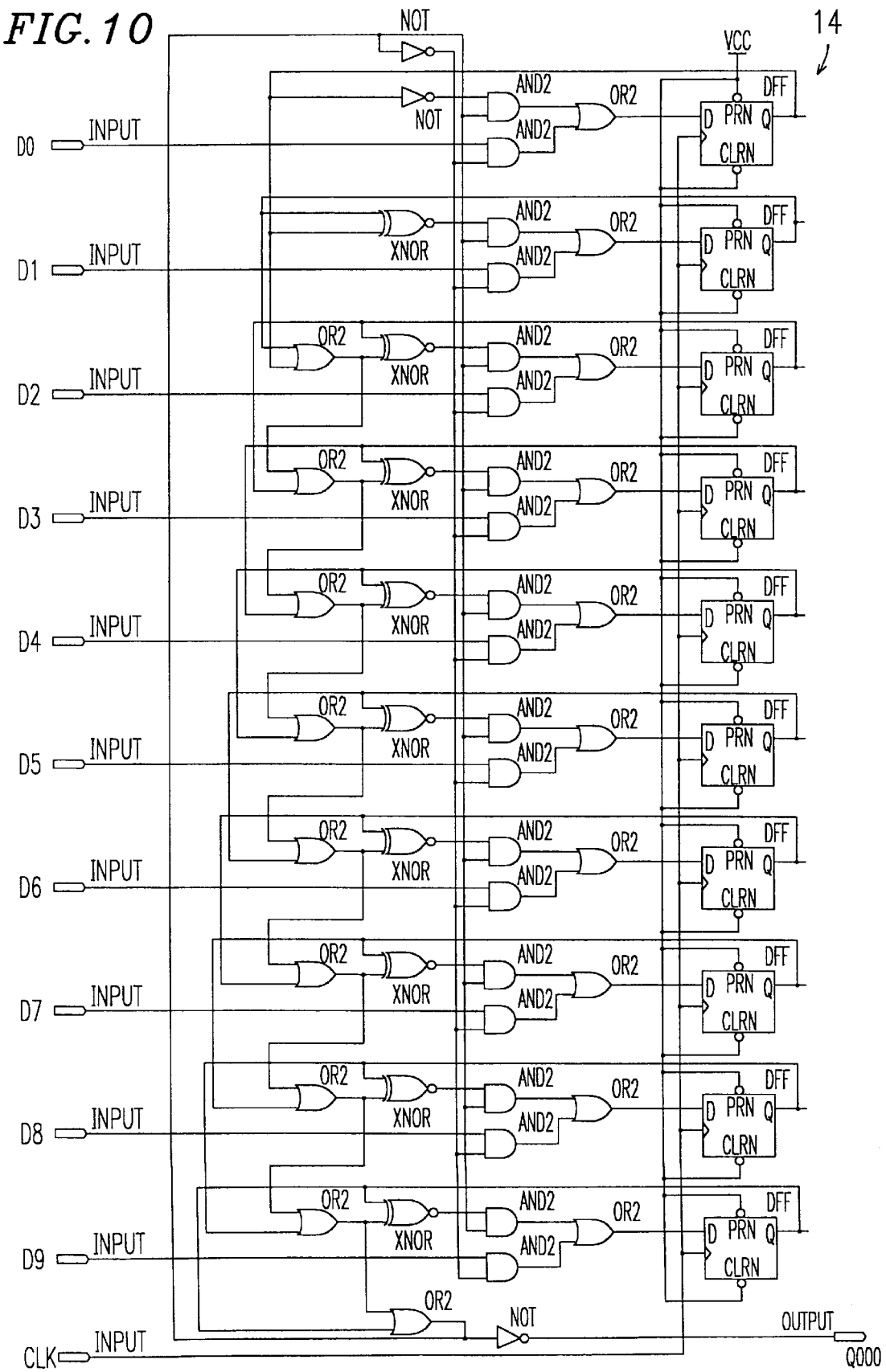
FIG. 10 is a block diagram illustrating a fifth counter circuit in the signal production circuit of FIG. 6 in greater detail.

Using the value t stored in the second memory 13, the fifth counter 14 illustrated in FIG. 10 generates one pulse each time the fifth counter 14 counts t reference clocks, thereby obtaining a timing signal for each half cycle of the target clock signal.

The fifth counter 14 of the present example decrements, starting from the maximum value t, each time the reference clock CLK is input. Since t=524 in this example, the value of the fifth counter 14 changes as follows: . . . , 2, 1, 524, 523, . . . , 2, 1, 524, 523, . . . . The fifth counter 14 generates a signal Q000 which is "H" when the value of fifth counter 14 is "1".

Using the DFF 15 (D flip flop circuit) with the clock signal Q000 generated by the fifth counter 14, a clock signal which oscillates with a cycle corresponding to the target period is obtained.

As described above, according to the present invention, it is possible to obtain a control signal indicating a required time period for driving a display device without providing the display device with an additional component for producing an additional reference clock. Therefore, it is possible to prevent an increase in the external size of the device and the power consumption and to solve the problem of undesired radiation.

The present invention can be advantageously used with display devices which are required to have a light weight, a thin shape, a low cost, and a low power consumption, such as a portable information apparatus using a battery as a power source. When producing a signal for driving a display device, it is desirable to produce a timing signal in synchronization with a display signal of the horizontal synchronization signal LP, in order to avoid a defect in the display quality. According to the present invention, the signal having the target period (time interval) is generated based on a reference clock signal CLK, and therefore is in synchronization with the vertical synchronization signal FP and the horizontal synchronization signal LP. Thus, it is possible to avoid a defect in the display quality due to the timing of the signal being shifted each time and thus being unstable because of use of a different, non-synchronous reference clock signal.

Moreover, by employing the present invention, it is possible to produce a display device having an external input interface signal specification such as that illustrated in FIG. 12. Therefore, an IC obtained by arranging logic circuits in accordance with the present invention is highly general-purpose and can be used with different resolutions among different models or among different display devices. Thus, the IC can be used with different models of display devices, thereby facilitating development of ICs and reducing the cost thereof by allowing for mass production.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A signal production circuit for producing a control signal used in a driving and controlling circuit of a display device externally input to the driving and controlling circuit, using an external interface signal, which includes a vertical synchronization signal having a predetermined frequency and a reference clock signal in synchronization with the vertical synchronization signal, the signal production circuit comprising:

a first counter circuit for counting a number of reference clock signal pulses up to a value of a parameter which is preset based on a time interval of one cycle of the vertical synchronization signal and a predetermined target period;

a second counter circuit for counting a number of reference clock signal pulses corresponding to the target period, the counting being performed based on the parameter and a number of reference clock signal pulses for one cycle of the vertical synchronization signal; and a signal output circuit for outputting a signal having a predetermined time period based on the number of reference clock signal pulses corresponding to the target period.

2. A signal production circuit according to claim 1, wherein:

a horizontal synchronization signal is input to the signal output circuit; and the signal output circuit produces and outputs the control signal which is obtained by delaying the horizontal synchronization signal by a delay period substantially equal to the target period.

3. A signal production circuit according to claim 2, wherein:

the parameter ($\alpha$) is a natural number which is calculated according to an expression:

$\alpha$=(a time for one cycle of the vertical synchronization signal(s))/(the target period(s))

where $\alpha$ is rounded off when the delay period of the signal to be output from the signal output circuit is greater than the target period and rounded up when the delay period of the signal to be output from the signal output circuit is less than the target period; and the number of reference clock signal pulses corresponding to the target period (t) counted by the second counter circuit is a natural number which is calculated according to an expression:

t=(a number of reference clock signal pulses for one cycle of the vertical synchronization signal)/$\alpha$ where t is rounded up when the delay period of the signal to be output from the signal output circuit is greater than the target period and rounded off when the delay period is less than the target period.

4. A signal production circuit according to claim 1, wherein:

the signal output circuit produces and outputs the control signal based on the number of reference clock signal pulses corresponding to the target period; and the control signal is a reference clock signal which oscillates with a cycle substantially corresponding to the target period.

5. A signal production circuit according to claim 4, wherein:

the parameter ($\beta$) is a natural number which is calculated according to an expression:

$\beta$={(a time for one cycle of the vertical synchronization signal(s))/(the target period(s))}×2 where $\beta$ is rounded off when the cycle period of the signal to be output from the signal output circuit is greater than the target period and rounded up when the cycle period of the signal to be output from the signal output circuit is less than the target period; and the number of reference clock signal pulses (t) counted by the second counter circuit and corresponding to one half of the target period is a natural number which is calculated according to an expression:

t=(a number of reference clock signal pulses for one cycle of the vertical synchronization signal)/β where t is rounded up when the cycle period of the signal to be output from the signal output circuit is greater than the target period and rounded off when the cycle period of the signal to be output from the signal output circuit is less than the target period.

6. A signal production circuit according to claim 5, further comprising a signal generation circuit for receiving the reference clock signal and generating a pulse each time it counts t reference clock signal pulses so as to generate a timing signal having a half cycle of the target period, with the generated timing signal being input to the signal output circuit.

7. A signal production circuit according to claim 1, further comprising a memory circuit for storing the number of reference clock signal pulses corresponding to a target period counted by the second counter circuit, with the stored number being thereafter input to a subsequent circuit.

8. A circuit for driving and controlling a liquid crystal display device, comprising a signal production circuit according to claim 1.

9. A method for producing a control signal used in a driving and controlling circuit of a display device, using an external interface signal externally input to the driving and controlling circuit, which includes a vertical synchronization signal having a predetermined frequency and a reference clock signal in synchronization with the vertical synchronization signal, the method comprising the steps of:

(a) counting a number of reference clock signal pulses up to a value of a parameter which is preset based on a time interval of one cycle of the vertical synchronization signal and a predetermined target period;

(b) counting a number of reference clock signal pulses corresponding to the target period, based on the parameter and a number of reference clock signal pulses for one cycle of the vertical synchronization signal; and (c) outputting a signal having a predetermined time based on the number of reference clock signal pulses corresponding to the target period.

10. A signal production method according to claim 9, wherein the signal outputting step comprises the step of producing and outputting the control signal which is obtained by delaying an input horizontal synchronization signal substantially by the target period.

11. A signal production method according to claim 10, wherein:

the preset parameter ($\alpha$) is a natural number which is calculated according to an expression:

$\alpha$=(a time for one cycle of the vertical synchronization signal(s))/(the target period(s))

where $\alpha$ is rounded off when the delay period of the signal to be output from the signal output circuit is greater than the target period and rounded up when the delay period of the signal to be output from the signal output circuit is less than the target period; and the number of reference clock signal pulses corresponding to the target period (t) counted in the reference clock signal counting step (b) is a natural number which is calculated according to an expression:

t=(a number of reference clock signal pulses for one cycle of the vertical synchronization signal)/$\alpha$ where t is rounded up when the delay period of the signal to be output from the signal output circuit is greater than the target period and rounded off when the delay period of the signal to be output from the signal output circuit is less than the target period.

12. A signal production method according to claim 9, wherein:

the signal output step comprises the step of producing and outputting the control signal based on the number of reference clock signal pulses corresponding to the target period; and the control signal is a reference clock signal which oscillates with a cycle corresponding to the target period.

13. A signal production method according to claim 12, wherein:

the preset parameter ($\beta$) is a natural number which is calculated according to an expression:

$\beta$={(a time for one cycle of the vertical synchronization signal(s))/(the target period(s))}×2 where $\beta$ is rounded off when the cycle period of the signal to be output from the signal output circuit is greater than the target period and rounded up when the cycle period of the signal to be output from the signal output circuit is less than the target period; and the number of reference clock signal pulses (t) counted in the reference clock signal counting step (b) and corresponding to one half of the target period is a natural number which is calculated according to an expression:

t=(a number of reference clock signal pulses for one cycle of the vertical synchronization signal)/$\beta$ where t is rounded up when the cycle period of the signal to be output from the signal output circuit is greater than the target period and rounded off when the cycle period of the signal to be output from the signal output circuit is less than the target period.

14. A signal production method according to claim 13, further comprising a signal generation step of receiving the reference clock signal and generating a pulse each time it counts t reference clock signal pulses so as to generate a timing signal having a half cycle of the target period, with the generated timing signal being used by the signal output step for producing and outputting a reference clock signal which oscillates with a cycle corresponding to the target period.

15. A signal production method according to claim 9, further comprising, after the reference clock signal counting step (b), the step of storing the number of reference clock signal pulses, with the number of reference clock signal pulses stored in the storing step being thereafter used in a subsequent step.

* * * * *